(12) United States Patent     (10) Patent No.: US 12,562,748 B2

Furuta     (45) Date of Patent: Feb. 24, 2026

(54) AD CONVERSION CIRCUIT PHOTOELECTRIC CONVERSION APPARATUS, PHOTOELECTRIC CONVERSION SYSTEM, AND MOVING BODY

(71) Applicant: CANON KABUSHIKI KAISHA, Tokyo (JP)

(72) Inventor: Masanori Furuta, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 74 days.

(21) Appl. No.: 18/635,545

(22) Filed: Apr. 15, 2024

(65) Prior Publication Data

US 2024/0348259 A1     Oct. 17, 2024

(30) Foreign Application Priority Data

Apr. 17, 2023 (JP) ................................. 2023-067175

(51) Int. Cl.
| | |
|---|---|
| *H03M 1/12* | (2006.01) |
| *H03M 3/00* | (2006.01) |
| *H04N 25/772* | (2023.01) |

(52) U.S. Cl.
CPC ............. *H03M 1/123* (2013.01); *H03M 3/39* (2013.01); *H04N 25/772* (2023.01)

(58) Field of Classification Search
CPC ........ H03M 1/123; H03M 1/14; H03M 1/145; H03M 3/39; H04N 25/772; H04N 25/773
USPC ........................................ 341/155, 143, 161
See application file for complete search history.

(56) References Cited

U.S. PATENT DOCUMENTS

| | | | | |
|---|---|---|---|---|
| 5,841,836 A | * | 11/1998 | Dunn | ...................... H04M 1/24 |
| | | | | 379/442 |
| 6,133,864 A | * | 10/2000 | Sabatini | .............. H03M 1/1225 |
| | | | | 341/161 |
| 7,098,834 B2 | * | 8/2006 | Linder | .................. H03M 1/007 |
| | | | | 341/162 |
| 7,289,054 B1 | * | 10/2007 | Watanabe | ............... H03M 3/35 |
| | | | | 341/143 |
| 10,868,554 B1 | | 12/2020 | Reitsma | |
| 2009/0261998 A1 | | 10/2009 | Chae | |
| 2010/0123491 A1 | * | 5/2010 | Palmer | ...................... H03L 7/22 |
| | | | | 327/156 |

(Continued)

FOREIGN PATENT DOCUMENTS

| | | |
|---|---|---|
| JP | 2021093725 A | 6/2021 |
| WO | 2016147523 A1 | 9/2016 |

*Primary Examiner* — Peguy Jean Pierre

(74) *Attorney, Agent, or Firm* — Canon U.S.A., Inc. IP Division

(57) ABSTRACT

An AD conversion circuit includes a plurality of first AD converters, a plurality of voltage holding circuits, a second AD converter, and a selector circuit. Each of the plurality of first AD converters includes a first input terminal. Each of the plurality of first AD converters is a delta-sigma AD converter. Each of the plurality of voltage holding circuits is connected to corresponding one of the plurality of first AD converters. The second AD converter is a delta-sigma AD converter and includes a second input terminal. The selector circuit is connected to the plurality of voltage holding circuits and to the second input terminal. The selector circuit is configured to select, from among the plurality of voltage holding circuits, a voltage holding circuit to be connected to the second input terminal.

17 Claims, 13 Drawing Sheets

(56)                    References Cited

U.S. PATENT DOCUMENTS

2017/0208285  A1      7/2017  Yu

* cited by examiner

TO FIG.2B

FROM FIG.2A

FIG. 3

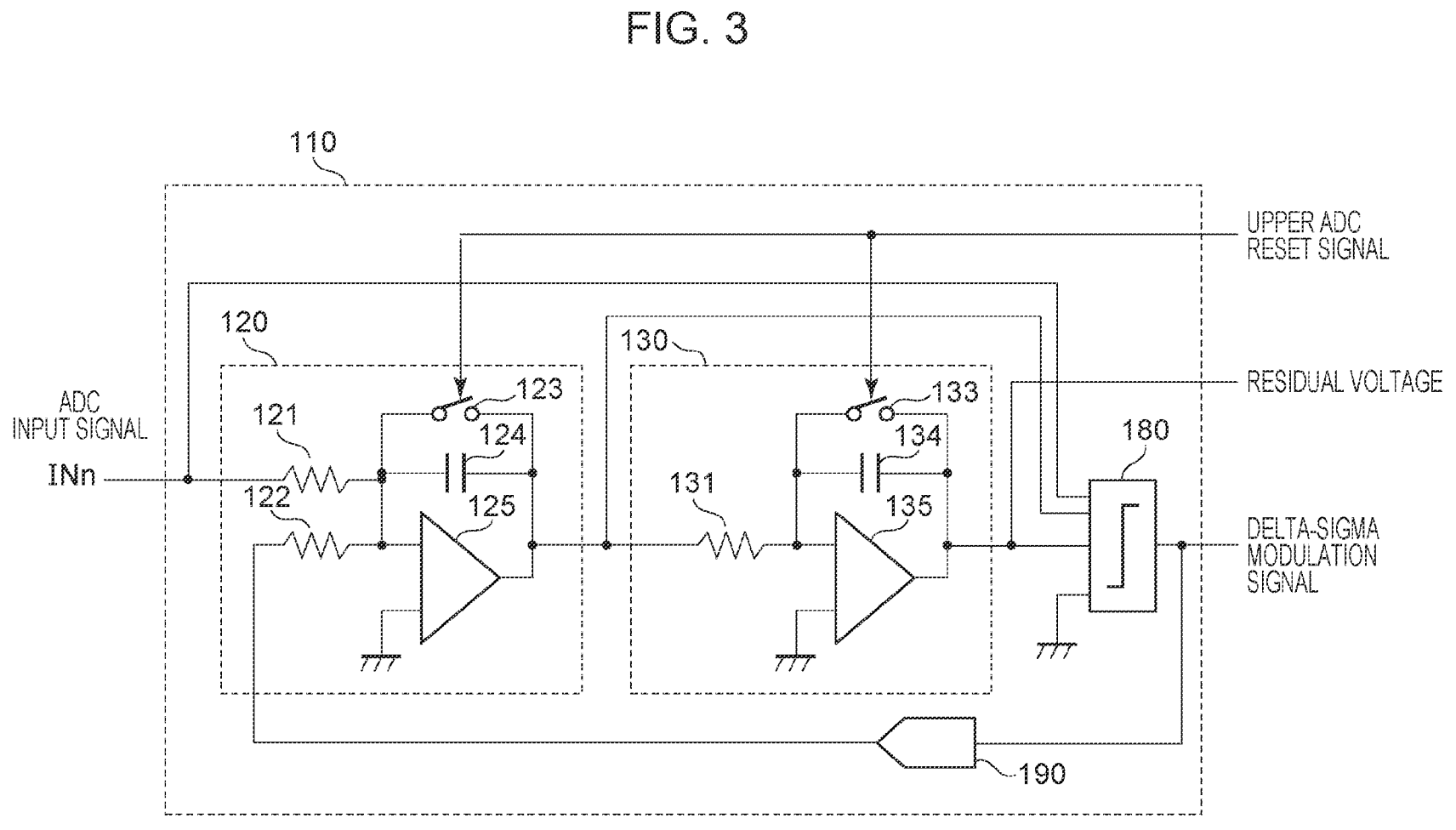

UPPER ADC
RESET SIGNAL

RESIDUAL VOLTAGE

DELTA-SIGMA
MODULATION
SIGNAL

110

120

121
122
123
124
125

130

131
133
134
135

180

190

ADC
INPUT SIGNAL
INn

FRONT VIEW

TOP VIEW

REAR VIEW

AD CONVERSION CIRCUIT PHOTOELECTRIC CONVERSION APPARATUS, PHOTOELECTRIC CONVERSION SYSTEM, AND MOVING BODY

BACKGROUND

Field of the Disclosure

The present disclosure relates to an analog-to-digital (hereinafter abbreviated as AD) conversion circuit configured to convert an analog signal into a digital signal, a photoelectric conversion apparatus including the AD conversion circuit, and equipment including the AD conversion circuit.

Description of the Related Art

An AD conversion circuit configured to convert signals outputted by pixels into a digital signal format is known. U.S. Patent Application Publication No. 2009/0261998 discloses an AD conversion circuit that includes a delta-sigma AD converter and a slope AD converter and converts an analog signal into a digital signal of a plurality of bits. In the AD conversion circuit disclosed in this publication, the delta-sigma AD converter generates a signal corresponding to bits that are relatively high in order, and the slope AD converter generates a signal corresponding to bits that are relatively low in order.

SUMMARY

An AD conversion circuit according to a certain aspect of the present disclosure includes a plurality of first AD converters, a plurality of voltage holding circuits, a second AD converter, and a selector circuit. Each of the plurality of first AD converters includes a first input terminal. Each of the plurality of first AD converters is a delta-sigma AD converter. Each of the plurality of voltage holding circuits is connected to corresponding one of the plurality of first AD converters. The second AD converter is a delta-sigma AD converter and includes a second input terminal. The selector circuit is connected to the plurality of voltage holding circuits and to the second input terminal. The selector circuit is configured to select, from among the plurality of voltage holding circuits, a voltage holding circuit to be connected to the second input terminal.

Further features of various embodiments will become apparent from the following description of exemplary embodiments with reference to the attached drawings.

BRIEF DESCRIPTION OF THE DRAWINGS

FIG. 3 is a diagram illustrating a configuration of a first AD converter according to the first embodiment.

FIG. 5 is a diagram illustrating another configuration example of a first AD converter according to the first embodiment.

FIG. 6 is a diagram illustrating a configuration example of a comparison circuit according to the first embodiment.

FIG. 10 is a diagram illustrating a configuration example of a photoelectric conversion apparatus.

DESCRIPTION OF THE EMBODIMENTS

Figure 1:
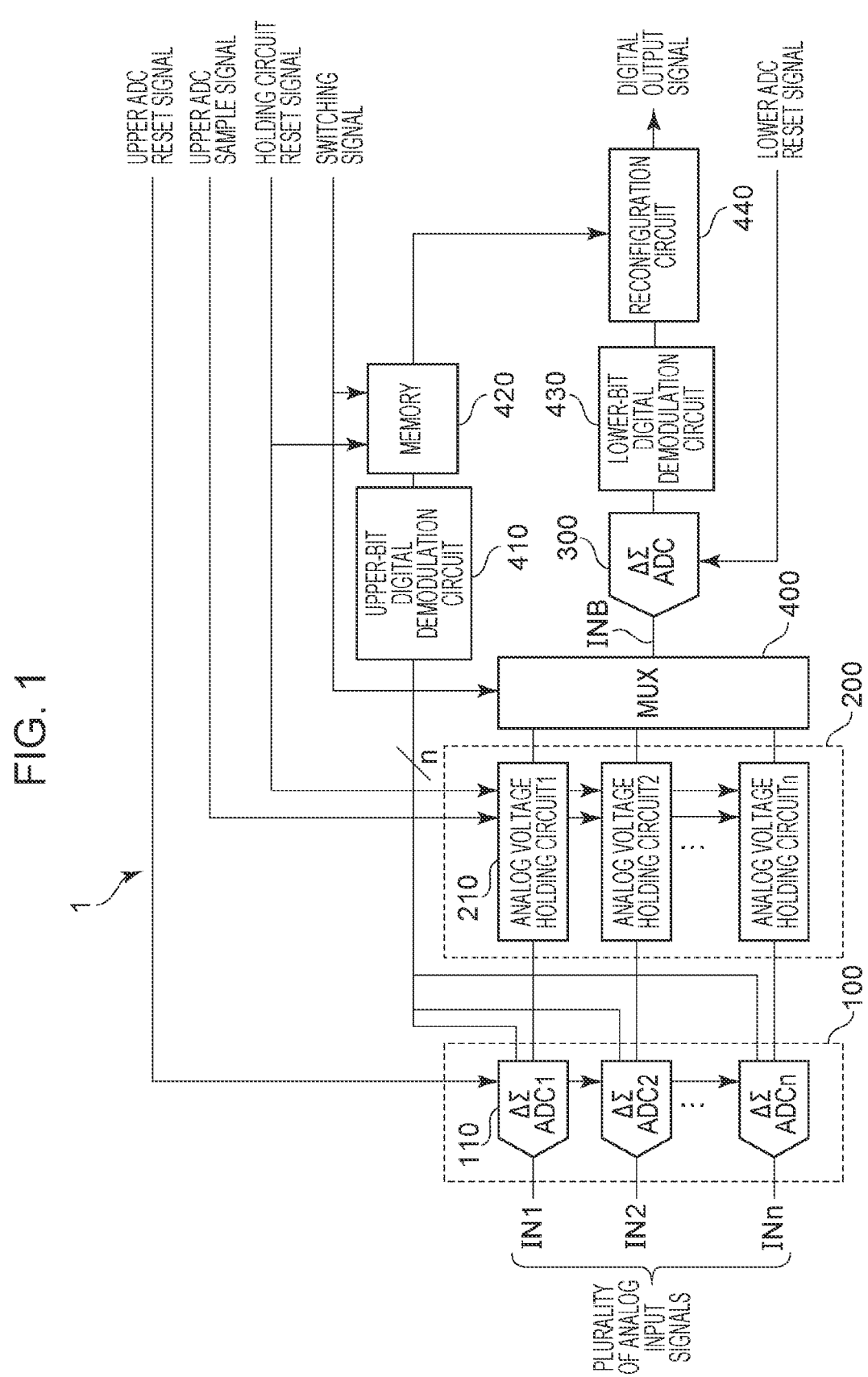
FIG. 1 is a diagram illustrating a configuration of an AD conversion circuit according to a first embodiment.

With reference to the drawings, embodiments will now be described.

In the technique disclosed in U.S. Patent Application Publication No. 2009/0261998, there is a room for further improvement in AD conversion operation of an AD conversion circuit. Embodiments described below relate to increasing the speed of AD conversion operation.

The description of each embodiment will be given below with a main focus on an AD conversion circuit, and on a photoelectric conversion apparatus including the AD conversion circuit. An imaging apparatus will be mainly described as an example of a photoelectric conversion apparatus. However, the scope of each embodiment is not limited to an imaging apparatus. Each embodiment may be applied to any other example of a photoelectric conversion apparatus. Some examples are a ranging apparatus (an apparatus configured to perform focus detection, a distance measurement using a time of flight (TOF), and the like) and a photometer (an apparatus configured to measure an amount of incident light, and the like), to name a few.

The conductivity type of each transistor described in the embodiments below is just an example and thus does not imply any limitation thereto. The conductivity type described in the embodiments may be changed. In accordance with this change, electric potentials at the gate, source, and drain of the transistor are changed as needed.

For example, for a transistor that operates as a switch, reversing the low and high levels of an electric potential supplied to its gate, in accordance with the change in conductivity type, from the description of the embodiments will work. The conductivity type of each semiconductor region described in the embodiments below is also just an example and thus does not imply any limitation thereto. The conductivity type described in the embodiments may be changed. In accordance with this change, the electric potential of the semiconductor region is changed as needed.

In the embodiments, connection of elements of a circuit to each other will be sometimes described below. In this case, even when there exists another element interposed between elements of interest, the elements of interest are deemed as being connected to each other. For example, suppose that an element A is connected to one node of a capacitive element C having a plurality of nodes, and an element B is connected to the other node thereof. Even in such a case, the elements A and B are deemed as being connected to each other, unless otherwise described.

The description of the embodiments below shall not be construed to limit the scope of the appended claims. Though a plurality of features will be described in the embodiments, not all of these features are necessarily indispensable to every embodiment. Any two or more of these features may be combined where necessary. In the attached drawings, the same reference numerals are assigned to the same or similar components, and the same explanation thereof will not be repeated.

First Embodiment

FIG. 1 is a diagram illustrating a configuration of an AD conversion circuit 1 according to a first embodiment of the present disclosure. The AD conversion circuit 1 includes a first AD conversion unit 100 configured to perform AD conversion for upper bits. The first AD conversion unit 100 includes a plurality of first AD converters 110, the number of which is denoted as n, and each of which is a delta-sigma AD converter (ΔΣ ADC). The numeral n may be any integer that is not less than two. FIG. 1 illustrates a case of n=4 or greater. Each of the n number of first AD converters 110 includes an input terminal INn (where n is the same as the ordinal number of the corresponding first AD converter), which is an example of a first input terminal. An individual analog signal is inputted to each of the plurality of input terminals INn. The AD conversion circuit 1 generates a plurality of digital signals corresponding to these individual analog signals respectively. Alternatively, as another mode, a common analog signal may be inputted to the plurality of input terminals INn. In this case, a plurality of digital signals is generated for one analog signal. It is possible to reduce a random noise by averaging the plurality of digital signals.

The AD conversion circuit 1 further includes an m number of second AD converter(s) 300 (each of) which belongs to an AD conversion unit for lower bits and is a delta-sigma AD converter. Though a case where m is one is illustrated in FIG. 1, m may be any integer that satisfies a relation of n>m≥1. The AD conversion circuit 1 includes a residual voltage holding circuit 200. The residual voltage holding circuit 200 includes an n number of analog voltage holding circuits 210. The AD conversion circuit 1 further includes a selector circuit 400. The selector circuit 400 is a multiplexer and is labeled as MUX in the drawing. The selector circuit 400 is connected to the n number of analog voltage holding circuits 210 and to the second AD converter 300. The selector circuit 400 selects one of the n number of analog voltage holding circuits 210 and connects the selected circuit to the second AD converter 300.

The AD conversion circuit 1 further includes an upper-bit digital demodulation circuit 410, which is an example of a first demodulation circuit.

The upper-bit digital demodulation circuit 410 is connected to the n number of first AD converters 110 via an n number of signal lines, that is, to each of the first AD converters 110 via the corresponding one of the n number of signal lines.

The AD conversion circuit 1 further includes a memory 420, a lower-bit digital demodulation circuit 430, which is an example of a second demodulation circuit, and a reconfiguration circuit 440. In FIG. 1, a control circuit that is not illustrated therein outputs an upper ADC reset signal to the n number of first AD converters 110. In FIG. 1, the control circuit that is not illustrated therein outputs a lower ADC reset signal to the m number of second AD converter(s) 300. In FIG. 1, the control circuit that is not illustrated therein outputs a holding circuit reset signal to the n number of analog voltage holding circuits 210. In FIG. 1, the control circuit that is not illustrated therein outputs a switching signal to the selector circuit 400.

A clock signal is inputted into each of the n number of first AD converters 110 from a circuit that is not illustrated in FIG. 1. The n number of first AD converters 110 perform AD conversion corresponding to upper bits on respective analog signals inputted respectively thereto, by using the clock that is not illustrated therein. During or after the upper-bit AD conversion, the residual signal of each of the first AD converters 110 is held as a voltage signal at the corresponding one of the analog voltage holding circuits 210. The respective residual voltages of the n number of first AD converters 110 are reset by using the upper ADC reset signal after finishing the upper-bit AD conversion.

Among the n number of analog voltage holding circuits 210, one analog voltage holding circuit 210 is selectively connected to an input terminal INB, which is an example of a second input terminal, of the second AD converter 300 by the selector circuit 400. The second AD converter 300 performs AD conversion corresponding to lower bits on the residual signal held by the selected analog voltage holding circuit 210.

The residual voltage of the second AD converter 300 is reset by using the lower ADC reset signal after finishing the lower-bit AD conversion. To correspond to n/m, which is a ratio of the number of the first AD converters 110, n, to the number of the second AD converter(s) 300, m, the cycle of the lower ADC reset signal in relation to the cycle of the upper ADC reset signal is set to be m/n. That is, the cycle of the lower ADC reset signal is set to be shorter than the cycle of the upper ADC reset signal.

Time-series delta-sigma modulation signals that are plural AD conversion results of the first AD conversion unit 100 are demodulated into multiple-bit digital signals as an example of a first digital signal by the upper-bit digital demodulation circuit 410 respectively. The demodulated digital signals are stored into the memory 420. A time-series delta-sigma modulation signal that is an AD conversion result of the second AD converter 300 is demodulated into a multiple-bit digital signal as an example of a second digital signal by the lower-bit digital demodulation circuit 430. The sequential order of outputting the plurality of digital signals stored in the memory 420 as the demodulation results of the upper-bit AD conversion is controlled by using the switching signal. By this means, the reconfiguration circuit 440 outputs a digital signal corresponding to an analog signal inputted to the input terminal INn by using a digital signal that is the demodulation result of the lower-bit AD conversion corresponding to an upper-bit digital signal and by using the upper-bit digital signal.

When the resolution of the plurality of first AD converters 110 is set to be M bits and the resolution of the second AD converter 300 is set to be L bits, the resolution of a digital signal after reconfiguration by the reconfiguration circuit 440 is M+L bits. This digital signal of the M+L bits is a digital signal corresponding to an analog signal inputted into the AD conversion circuit 1. This digital signal is outputted from the AD conversion circuit 1 as a digital output signal illustrated in FIG. 1.

Figure 2A:
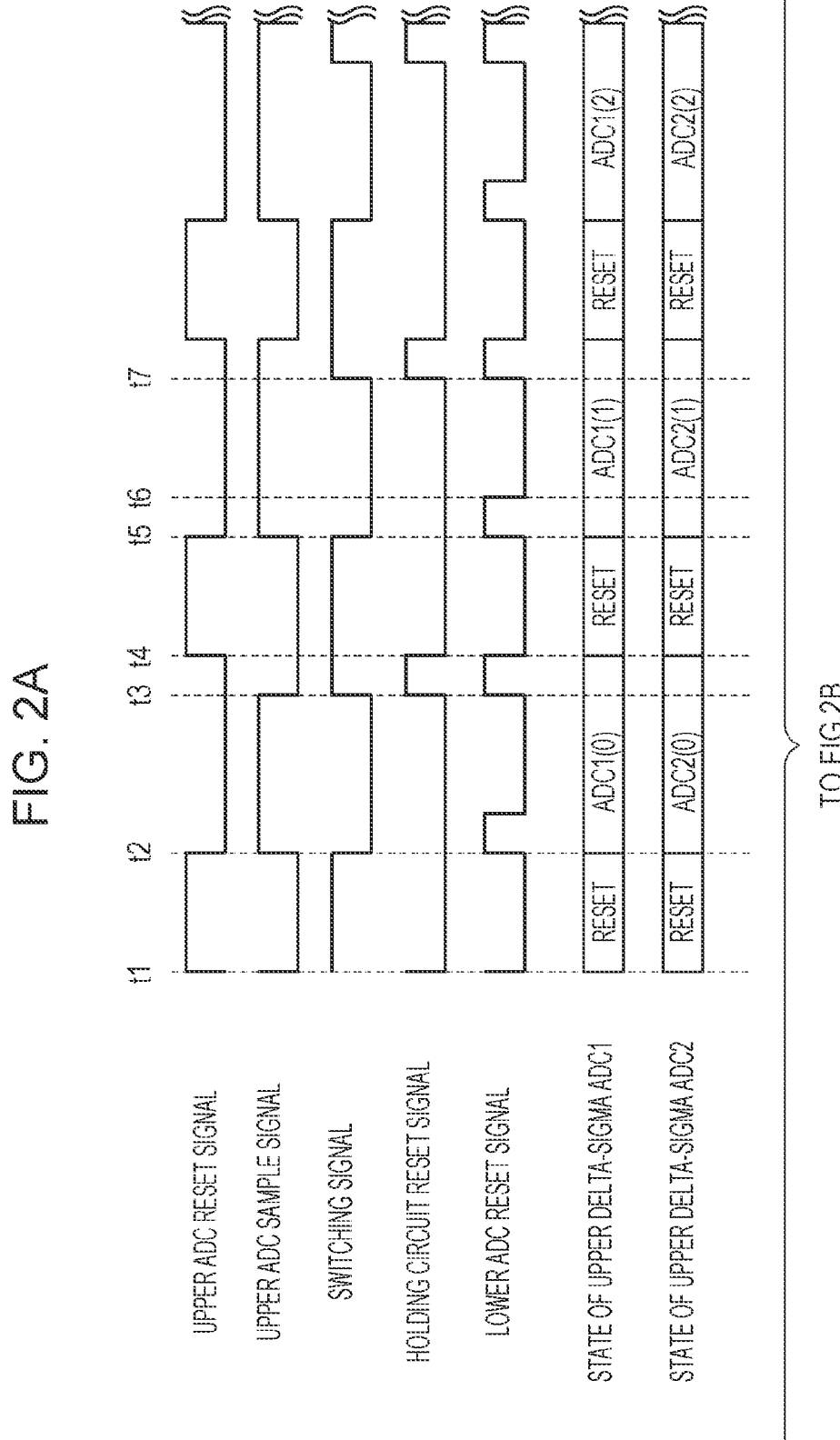
FIGS. 2A and 2B are a diagram illustrating operation of the AD conversion circuit according to the first embodiment.
Figure 2B:
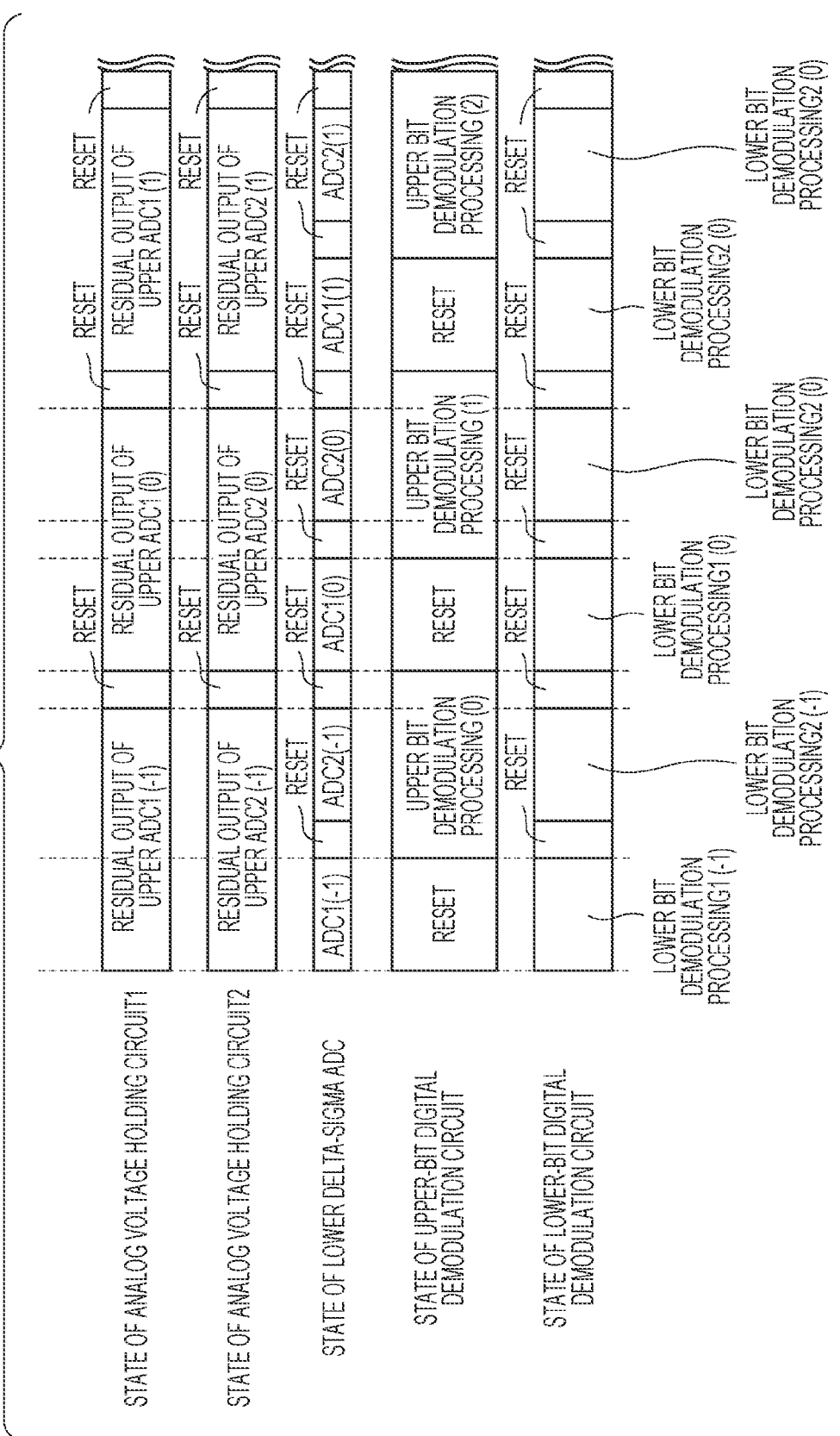

FIGS. 2A and 2B are a timing chart illustrating operation of the AD conversion circuit 1 illustrated in FIG. 1. As an example of operation of a two-stage delta-sigma ADC including the first AD conversion unit 100 and the second AD converter 300, the operation will be described while assuming that the first AD conversion unit 100 includes two first AD converters 110 (i.e., n=2) and one second AD converter 300 (i.e., m=1). The description will be given while assuming that the number of analog voltage holding circuits of the residual voltage holding circuit 200 is also two.

During a period from a point in time t1 to a point in time t2, the upper ADC reset signal is in a state of a high level (hereinafter will be referred to as "High"), and, in this state, each of the two first AD converters 110 of the first AD conversion unit 100 and the upper-bit digital demodulation circuit 410 are reset.

During a period from the point in time t2, at which the upper ADC reset signal turns to a low level (hereinafter will be referred to as "Low"), to a point in time t4, the two first AD converters 110 perform AD conversion by using non-illustrated clock signals inputted into them respectively. This AD conversion is AD conversion corresponding to upper bits. Then, demodulation processing of the upper bits is performed by the upper-bit digital demodulation circuit 410. In addition, during the same period, the two analog voltage holding circuits 210 of the residual voltage holding circuit 200 perform residual voltage sampling operation.

During a period from a point in time t3 to the point in time t4, the holding circuit reset signal is in a state of High. This resets the two analog voltage holding circuits 210 of the residual voltage holding circuit 200.

In addition, during the period from the point in time t3 to the point in time t4, the lower ADC reset signal is in a state of High. This resets the second AD converter 300. Concurrently with this operation, the lower-bit digital demodulation circuit 430 is reset.

During a period from the point in time t4 to a point in time t7, the residual voltage holding circuit 200 performs voltage holding operation of each sampled residual voltage.

Triggered by the switching signal inputted from the control circuit, the selector circuit 400 selects the analog voltage holding circuit 210 that is to be connected to the second AD converter 300.

During a period from the point in time t3 to a point in time t5, the switching signal is in a state of High. Accordingly, one (the 1st analog voltage holding circuit) of the two analog voltage holding circuits 210 is selected.

On the other hand, during a period from the point in time t5 to the point in time t7, the switching signal is in a state of Low. Accordingly, the other (the 2nd analog voltage holding circuit) of the two analog voltage holding circuits 210 is selected.

During a period from the point in time t4 to the point in time t5, the second AD converter 300 performs AD conversion corresponding to lower bits of the delta-sigma ADC1, which is one of the first AD converters 110, by using the non-illustrated clock signal. Then, the lower-bit digital demodulation circuit 430 performs demodulation processing of the lower bits.

On the other hand, during the period from the point in time t5 to the point in time t7, in which the switching signal is in a state of Low, AD conversion corresponding to lower bits of the delta-sigma ADC2, which is the other of the first AD converters 110, is performed.

During a period from a point in time t6 to the point in time t7, the second AD converter 300 performs AD conversion corresponding to lower bits of the delta-sigma ADC2, which is the other of the first AD converters 110, by using the non-illustrated clock signal. Then, the lower-bit digital demodulation circuit 430 performs demodulation processing of the lower bits.

During a period from the point in time t5 to the point in time t6, the second AD converter 300 and the lower-bit digital demodulation circuit 430 are reset.

The operations illustrated in FIGS. 2A and 2B have been described based on an assumed configuration that includes two first AD converters 110 and one second AD converter 300. In addition, the reset cycle of the second AD converter 300 is set to be more than double the reset cycle of the first AD converter 110. This makes it possible to perform AD conversion at a high speed on two analog signals inputted into the AD conversion circuit 1.

The resetting of the first AD converter 110 and the second AD converter 300 is a period provided for realizing incremental (integral) operation as operation of the delta-sigma ADC. There are a total period A and a total period B. The total period A is a sum of the period of the resetting of the first AD converter 110 and the period of the upper-bit AD conversion executed by the first AD converter 110. The total period B is a sum of the period of the resetting executed twice and the period of the lower-bit AD conversion executed twice by the second AD converter 300. In a two-stage delta-sigma ADC, the length of the total period A is set to be equal to the length of the total period B.

In FIG. 3, a configuration of a second-order continuous-time delta-sigma AD converter is illustrated as a first configuration example of the first AD converter 110. The first AD converter 110 according to the first configuration example may include a first integrator 120, a second integrator 130, a comparator 180, and a digital-to-analog converter (DA converter) 190. The first integrator 120 may include, for example, resistive elements 121 and 122, a capacitive element 124, a switch 123, and an amplifier 125. The second integrator 130 may include, for example, a resistive element 131, a capacitive element 134, a switch 133, and an amplifier 135.

An output of the selector circuit 400 is supplied as an ADC input signal to an input terminal of the first integrator 120. An output of the first integrator 120 is supplied to the second integrator 130. An output of the second integrator 130 is supplied to the comparator 180. An output of the comparator 180 is supplied to the DA converter 190. An output of the DA converter 190 is supplied to the resistive element 122 of the first integrator 120. The output of the second integrator 130 is outputted as a residual voltage of the first AD converter 110.

In the first AD converter 110, each of the capacitive elements 124 and 134 is reset when the upper ADC reset signal is in a state of High. The first integrator 120 integrates a difference signal between the ADC input signal and the output of the DA converter 190 when the upper ADC reset signal is in a state of Low. The second integrator 130 integrates a difference signal between an output voltage of the first integrator 120 and the output of the DA converter 190. Upon receiving a difference signal between an output voltage of the second integrator 130 and a reference signal, the comparator 180 performs comparison operation by using a non-illustrated clock signal. The DA converter 190 outputs an analog voltage in accordance with an output signal of the comparator 180. The DA converter 190 may be configured to output an analog voltage that is dependent on an input signal, for example, in accordance with a 1-bit transfer function expressed by Equation 1.

$$DACout(DACin) = \begin{cases} Vr, & (DACin = 1) \\ 0, & (DACin = 0) \end{cases} \quad (1)$$

In the above equation, DACin denotes an output signal of the comparator 180, Vr denotes a non-illustrated reference signal in the first AD converter 110, and DACout denotes an output signal of the DA converter 190, where the reference signal is zero. The AD conversion circuit 1 of FIG. 3 performs an integration operation, a comparison operation, and a digital-to-analog conversion repeatedly until the upper ADC reset signal turns to High from Low.

In the example illustrated in FIG. 3, the AD conversion circuit 1 is configured as a second-order continuous-time delta-sigma AD conversion circuit. In addition, in the example illustrated in FIG. 3, both the comparator 180 and the DA converter 190 in the AD conversion circuit 1 have a 1-bit configuration. However, the comparator 180 and the DA converter 190 may be configured in a multiple-bit manner, and the resistive element 122 of the first integrator 120 may be increased to be connected in parallel in accordance with the resolution of the comparator 180 and the DA converter 190. Configuring the comparator 180 and the DA converter 190 in a multiple-bit manner makes it possible to increase the speed of AD conversion of the continuous-time delta-sigma AD converter 110. One or more integrators may be added between the second integrator 130 and the comparator 180, thereby configuring a third-order continuous-time delta-sigma AD converter or higher. Increasing the number of the integrators makes it possible to increase the speed of AD conversion of the continuous-time delta-sigma AD converter 110.

With reference to FIG. 3, the configuration of the first AD converter 110 has been described. This configuration can be applied to the second AD converter 300, except for some differences. "Some differences" are as follows: firstly, though the first AD converter 110 includes wiring for outputting the residual voltage to the outside of the first AD converter 110, this wiring can be omitted. Moreover, the lower ADC reset signal is inputted in place of the upper ADC reset signal disclosed in the configuration of FIG. 3. Except for these differences, the configuration of the second AD converter 300 may be the same as that of the first AD converter 110. As will be described later, the capacitance value of each capacitive element of the first AD converter 110 and the capacitance value of each capacitive element of the lower ADC can be changed as needed.

Figure 4:
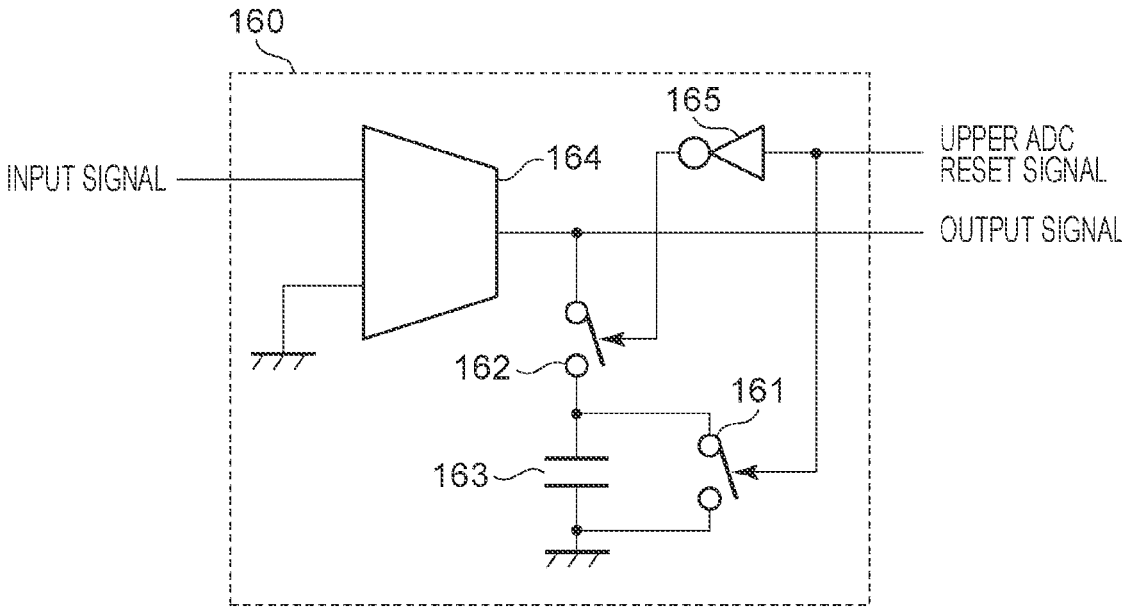
FIG. 4 is a diagram illustrating another configuration example of an integrator according to the first embodiment.

FIG. 4 illustrates a configuration of a gm-C integrator 160 as another configuration example of each of the first integrator 120 and the second integrator 130 in the first AD converter 110. The integrator 160 may include switches 161 and 162, a capacitive element 163, a trans-conductance 164, and an inverter 165. The switch 161 is controlled by using the upper ADC reset signal. The switch 162 is controlled by using the upper ADC reset signal inverted by the inverter 165. The capacitive element 163 is reset when the upper ADC reset signal is in a state of High. When the upper ADC reset signal is in a state of Low, an integration operation is performed based on a difference current between an electric current generated at the trans-conductance 164 in accordance with an input signal and an output-signal current of the DA converter 190 and based on the capacitive element 163. When the integrator 160 that is of a gm-C type is used as the first integrator 120, the output of the DA converter 190 is connected to the output of the trans-conductance 164. This configuration makes it possible to reduce power consumption while realizing the same functions as those of, or similar thereto, an integrator that includes a resistive element, a capacitive element, and an amplifier. The integrator 160 can also be applied to the second AD converter 300. In that case, the lower ADC reset signal is inputted in place of the upper ADC reset signal.

Figure 5:
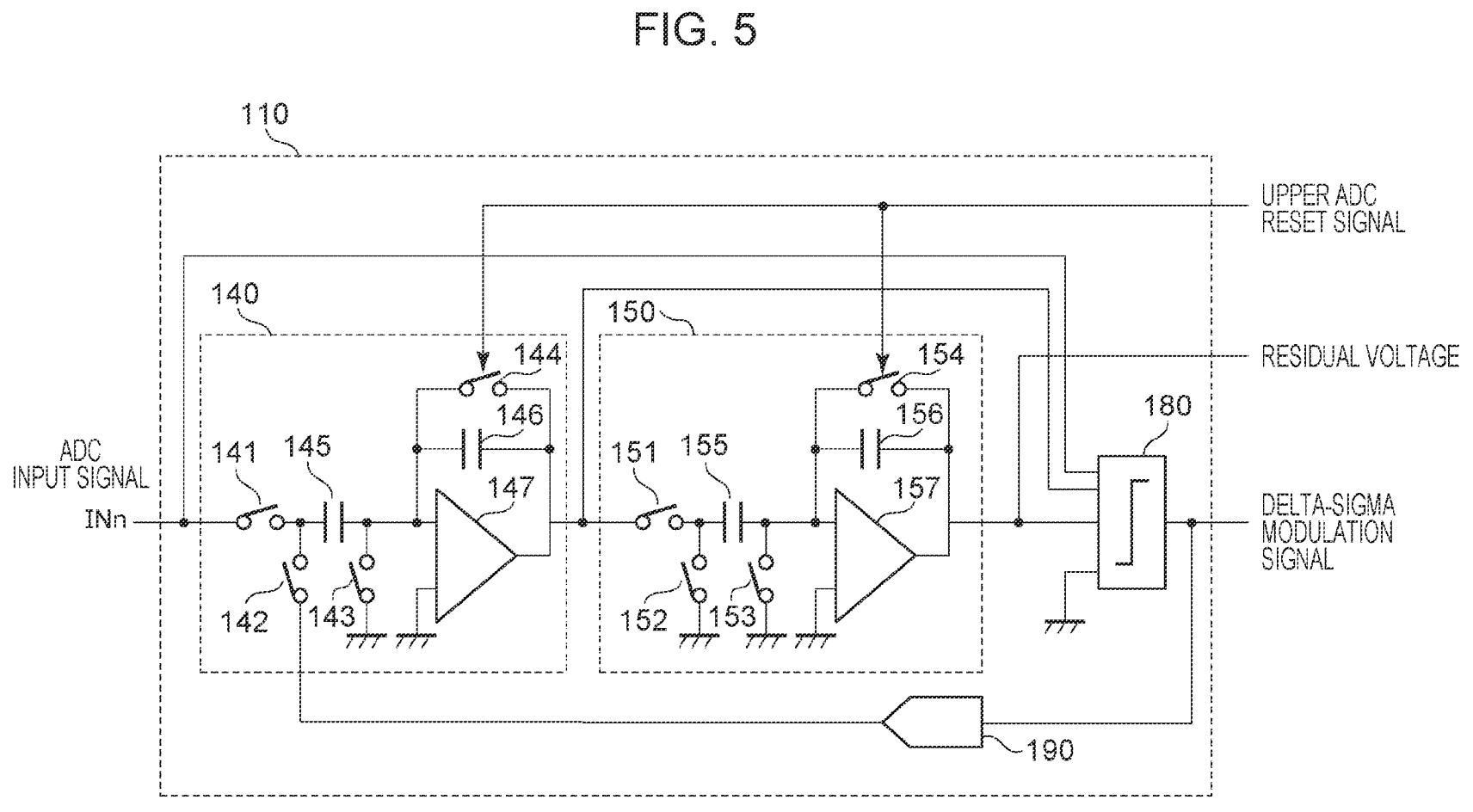

In FIG. 5, a configuration of a second-order discrete-time delta-sigma ADC is illustrated as a detailed configuration example of the first AD converter 110. The illustrated circuit includes switches 141, 142, 143, and 144 and capacitive elements 145 and 146. The illustrated circuit includes a first integrator 140 including an amplifier 147, a second integrator 150 including switches 151, 152, 153, and 154, capacitive elements 155 and 156, and an amplifier 157, and the comparator 180 and the digital-to-analog converter 190. An output of the first integrator 140 is inputted into the second integrator 150. An output of the second integrator 150 is inputted into the comparator 180. In addition, signals inputted into and outputted from the first integrator 140 are inputted into the comparator 180. An output of the comparator 180 is inputted into the digital-to-analog converter 190, an output of which is inputted into the switch 142 of the first integrator 140. An output of the second integrator 150 is outputted as a residual voltage of the first AD converter 110.

In the discrete-time delta-sigma ADC illustrated in FIG. 5, each of the capacitive elements 146 and 156 is reset when the upper ADC reset signal is in a state of High. When the upper ADC reset signal is in a state of Low, the first integrator 140 integrates a difference voltage between the ADC input signal and the output of the digital-to-analog converter 190 by using a non-illustrated clock. The second integrator 150 integrates an output voltage of the first integrator 140 by using a non-illustrated clock. The comparator 180 receives, as its inputs, the input and output of the first integrator 140 and a difference voltage between the output voltage of the second integrator 150 and the reference voltage, and performs comparison operation by using a non-illustrated clock signal. The digital-to-analog converter 190 outputs an analog voltage in accordance with the output signal of the comparator 180 according to, for example, the 1-bit transfer function expressed by Equation 1. The circuitry of the second integrator 150 may be configured to be the same as, or similar to, that of the first integrator 140, and arithmetic processing using the output signal of the digital-to-analog converter 190 may be performed.

In FIG. 5, the description has been given while taking, as an example, a case of a second-order discrete-time delta-sigma ADC where both the comparator 180 and the digital-to-analog converter 190 have a 1-bit configuration. As another example, the comparator and the DA converter may be configured in a multiple-bit manner, and the switch 142 and the capacitive element 145 of the first integrator 140 may be increased to be connected in parallel in accordance with the resolution of the comparator and the DA converter. Configuring the comparator 180 and the DA converter 190 in a multiple-bit manner makes it possible to increase the speed of AD conversion of the discrete-time delta-sigma ADC 140. The number of integrators may be increased by addition between the second integrator 150 and the comparator 180, thereby configuring a third-order discrete-time delta-sigma ADC or higher. Increasing the number of the integrators makes it possible to increase the speed of AD conversion of the discrete-time first AD converter 110.

Figure 6:
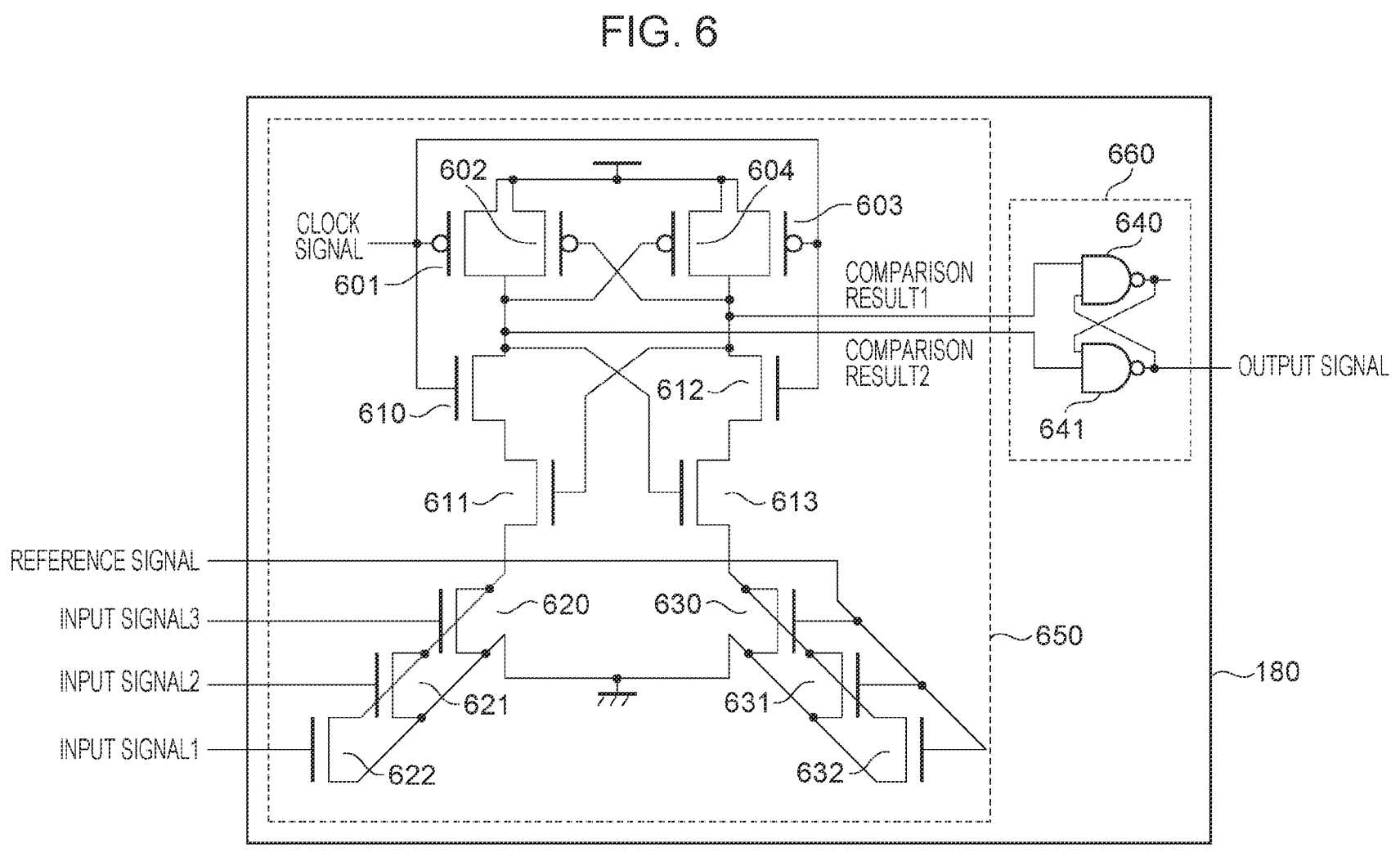

A configuration example of a four-input comparator 180 is illustrated in FIG. 6. The four-input comparator 180 may include a latch comparator 650 and an SR flip flop 660. The latch comparator 650 may include, for example, PMOS transistors 601, 602, 603, and 604, NMOS transistors 610, 611, 612, and 613, and input transistors 620, 621, 622, 630, 631, and 632. The SR flip flop 660 may include NAND gates 640 and 641. In the configuration example of the four-input comparator 180 illustrated in FIG. 6, when a clock signal is in a state of Low, the latch comparator 650 is in a reset state, a comparison result 1 and a comparison result 2, which are output signals, are in a state of High, and the SR flip flop 660 is in a held state. When the clock signal is in a state of High, the latch comparator 650 generates an internal signal corresponding to a difference voltage with respect to the reference signal for each of three input signals, and outputs results corresponding to these internal signals as the comparison results 1 and 2. The SR flip flop 660 outputs signals corresponding to the comparison results 1 and 2. In the four-input comparator 180, if, for example, a sum voltage of an input signal 1—the reference voltage, an input signal 2—the reference voltage, and an input signal 3—the reference voltage is a positive voltage, the comparison result 1 indicates a state of Low, the comparison result 2 indicates a state of High, and the output signal indicates a state of High.

Though a four-input comparator has been disclosed in the configuration example of FIG. 6, a configuration corresponding to a third-order continuous-time delta-sigma AD converter or higher can be obtained by increasing the number of input transistors.

Figure 7A:
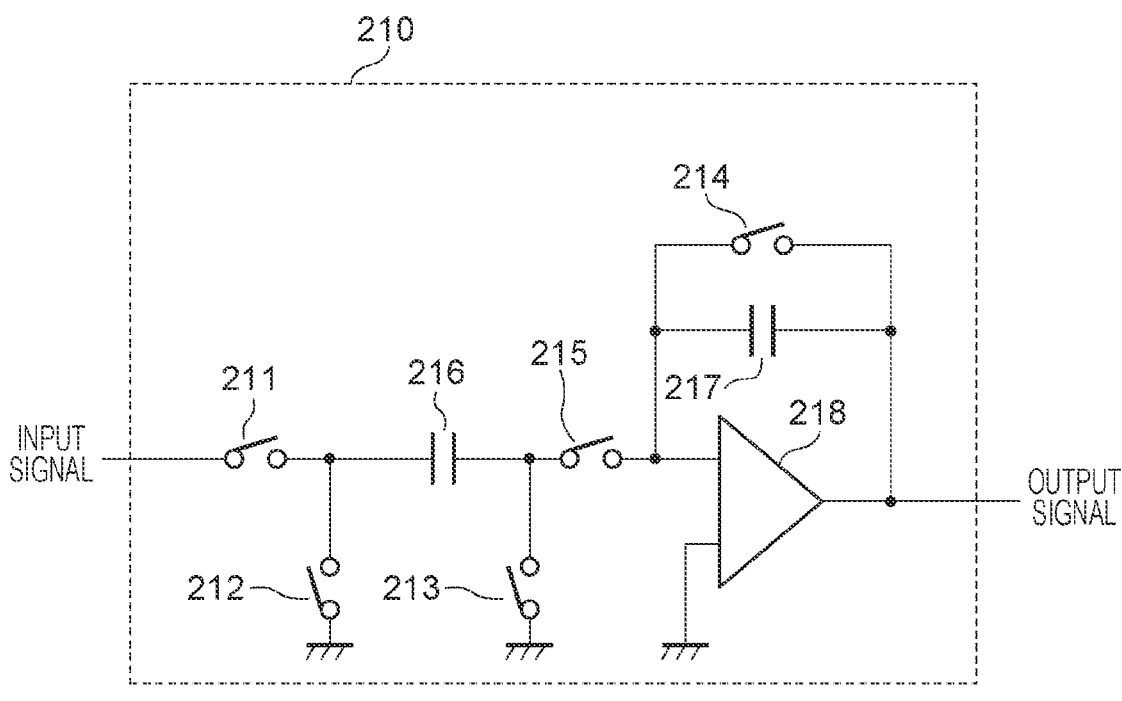
FIG. 7A is a diagram illustrating a configuration of an analog voltage holding circuit according to the first embodiment.
Figure 7B:
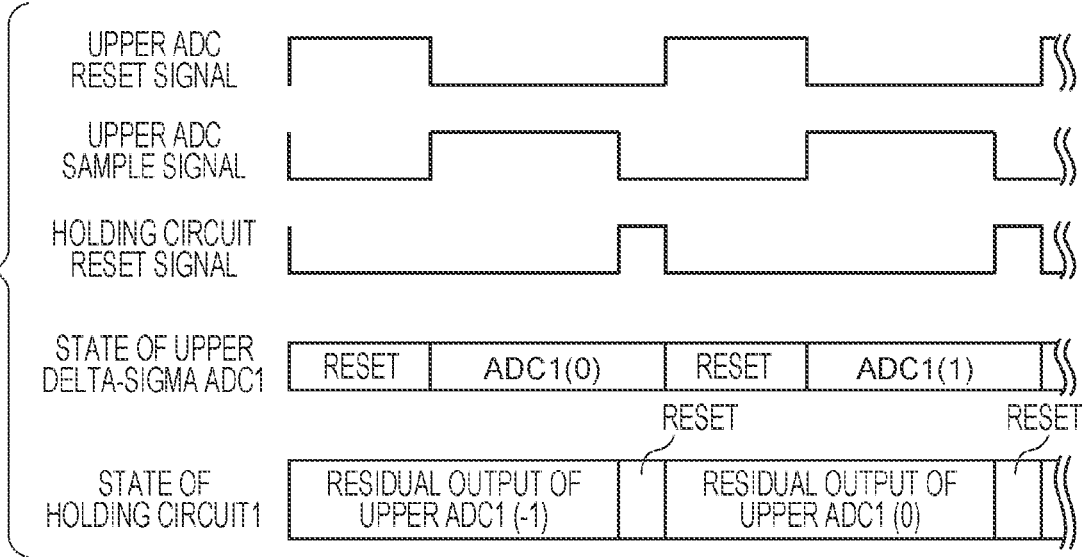
FIG. 7B is a timing chart of the analog voltage holding circuit according to the first embodiment.

FIGS. 7A and 7B illustrate a configuration example and a timing chart of the analog voltage holding circuit 210. The analog voltage holding circuit 210 includes switches 211 and 213, which are controlled by using an upper ADC sample signal, and switches 212 and 215, which are controlled by using an upper ADC reset signal. The analog voltage holding circuit 210 further includes a switch 214, which is controlled by using a holding circuit reset signal, an amplifier 218, and capacitive elements 216 and 217. In the analog voltage holding circuit 210, the capacitive element 217 is reset when the holding circuit reset signal is in a state of High. An input signal is sampled at the capacitive element 216 when the upper ADC sample signal is in a state of High, the holding circuit reset signal is in a state of Low, and the upper ADC reset signal is in a state of Low. The voltage sampled at this time is a residual voltage after 1-bit AD conversion corresponding to upper bits. Electric charges sampled at the capacitive element 216 are transferred to the capacitive element 217 when the upper ADC sample signal is in a state of Low, the upper ADC reset signal is in a state of High, and the holding circuit reset signal is in a state of Low.

The sampled voltage is held at the capacitive element 217 even after a point in time at which the upper ADC reset signal turns Low.

The upper-bit digital demodulation circuit 410 illustrated in FIG. 1 outputs an upper-bit demodulation signal for upper M bits by performing digital signal processing according to Equation 2 by using a non-illustrated clock signal on a 1-bit time-series delta-sigma modulation signal corresponding to upper bits of the first AD converter 110.

$$\begin{array}{l} higher-order-bit \\ demodulation\ signal \end{array} = \frac{2}{OSRM(OSRM+1)}\sum_{K=1}^{OSRM}\sum_{i=1}^{K}DACin\,[i] \quad (2)$$

In the above equation, OSRM denotes an over-sample ratio in AD conversion performed by the first AD converter 110, and i denotes a time index of comparison results outputted in a time series. The signal having been demodulated into a multiple-bit signal format is thereafter stored into the memory 420 illustrated in FIG. 1. The upper-bit digital demodulation circuit 410 according to the foregoing example illustrated in FIG. 1 performs demodulation operation into a multiple-bit signal at a frequency that is N times as high as that of the first AD converter 110. As another example, a plurality of upper-bit digital demodulation circuits 410 the number of which is the same as the number of the first AD converters 110 may be provided, and the plurality of upper-bit digital demodulation circuits 410 may perform arithmetic processing in parallel.

The lower-bit digital demodulation circuit 430 outputs a lower-bit demodulation signal for lower L bits by performing digital signal processing according to Equation 3 on a 1-bit time-series delta-sigma modulation signal outputted by the lower-bit-converting delta-sigma ADC 300.

$$\begin{array}{l} lower-order-bit \\ demodulation\ signal \end{array} = \frac{2}{OSRM(OSRM+1)}\sum_{K=1}^{OSRM}\sum_{i=1}^{K}DACin\,[i] \quad (3)$$

In the above equation, OSRL denotes an over-sample ratio in AD conversion performed by the lower-bit-converting delta-sigma ADC 300, and i denotes a time index of comparison results outputted in a time series.

The reconfiguration circuit 440 illustrated in FIG. 1 performs reconfiguration processing according to Equation 4 on the upper-bit demodulation signal stored in the memory 420 and the lower-bit demodulation signal corresponding to the output of each of the first AD converters 110 of the upper-bit-converting ADC 100. This reconfiguration processing is normalized such that, if a combination signal of the upper-bit demodulation signal and the lower-bit demodulation signal is hypothetically assumed to be a decimal-number signal (actually, a binary-number signal), the maximum value in the decimal notation will be one. For example, when a signal whose value is 15 in the decimal notation is generated, this reconfiguration processing multiplies the upper-bit demodulation signal and the lower-bit demodulation signal by 1/15. In this way, a final digital signal is obtained, where the final digital signal is a final AD conversion result of the M+L bits normalized with 1 taken as the maximum value when hypothetically assumed to be converted to base 10.

$$final\ digital\ signal = \qquad\qquad\qquad\qquad (4)$$
$$\begin{array}{l} higher-order-bit \\ demodulation\ signal \end{array} + \frac{2}{M(M+1)}\begin{array}{l} lower-order-bit \\ demodulation\ signal \end{array}$$

The resolution M of the first AD conversion unit 100 illustrated in FIG. 1 and the resolution L of the second AD converter 300 illustrated therein are set to be M>L for any arbitrary two-stage delta-sigma ADC. That is, the number of bits of the digital signal generated by the second AD converter 300 is greater than the number of bits of the digital signal generated by the first AD conversion unit 100. This makes it possible to reduce the AD conversion cycle count corresponding to the lower bits. Moreover, it is possible to increase the speed of two-stage delta-sigma ADC operation performed by the AD conversion circuit 1 by causing the second AD converter 300 to operate at a high speed.

It is possible to relax the requirements regarding noise and linearity of the second AD converter 300 in relation to the first AD conversion unit 100. This is because the capacitance values of the integrator circuits illustrated in FIGS. 3, 4, and 5 can be reduced and, even with low power consumption, the speed of the integration operation can be increased.

Furthermore, it is possible to increase the speed of the AD conversion circuit 1. For example, the number of bits of the digital signal generated by the first AD converter 110 and the number of bits of the digital signal generated by the second AD converter 300 are set to be M<L. That is, the number of bits of the digital signal generated by the first AD converter 110 is less than the number of bits of the digital signal generated by the second AD converter 300. This makes it possible to reduce the AD conversion cycle count corresponding to the upper bits. Moreover, the capacitance value of the second AD converter 300 is set to be less than that of the first AD converter 110. The capacitance value mentioned here is the value of at least one of the capacitive element 124 illustrated in FIG. 3, the capacitive element 134 illustrated in FIG. 3, and the capacitive element 163 illustrated in FIG. 4. That is, the capacitance values of all of the capacitive elements 124 and 134 illustrated in FIG. 3 of the first AD converter 110 and the capacitive element 163 illustrated in FIG. 4 may be set to be less than the corresponding capacitance values of the respective capacitive elements of the second AD converter 300. In the case of the configuration illustrated in FIG. 5, the capacitance value mentioned here is the value of at least one of the capacitive elements 145, 146, 155, and 156 and the capacitive element 163. This makes it possible to make the circuit area size of the second AD converter 300 smaller than the circuit area size of one first AD converter 110. Moreover, this makes it easier to make the operation speed of the second AD converter 300 higher than the operation speed of the first AD converter 110. Then, it is possible to increase the speed of two-stage delta-sigma ADC operation by causing the first AD converter 110 to operate at a high speed. A capacitance ratio between an input capacitance and a feedback capacitance of an integrator of the first AD converter 110 may be the same as a capacitance ratio between an input capacitance and a feedback capacitance of an integrator of the second AD converter 300.

In the technique disclosed in U.S. Patent Application Publication No. 2009/0261998, AD conversion corresponding to lower bits is slope-type AD conversion. Therefore, there are limits in terms of the speed of generation of a sloped signal (ramp signal) and in terms of an operation frequency of a counter configured to perform clock signal counting, and thus there are limits in increasing the speed. By contrast, in the present disclosure, the AD converter corresponding to lower bits has a configuration of a delta-sigma AD converter. This configuration realizes faster AD conversion operation than in the technique disclosed in U.S. Patent Application Publication No. 2009/0261998.

Second Embodiment

Next, with reference to FIG. 8, an AD conversion circuit according to a second embodiment will now be described. The points of difference from the first embodiment will be mainly described.

Figure 8:
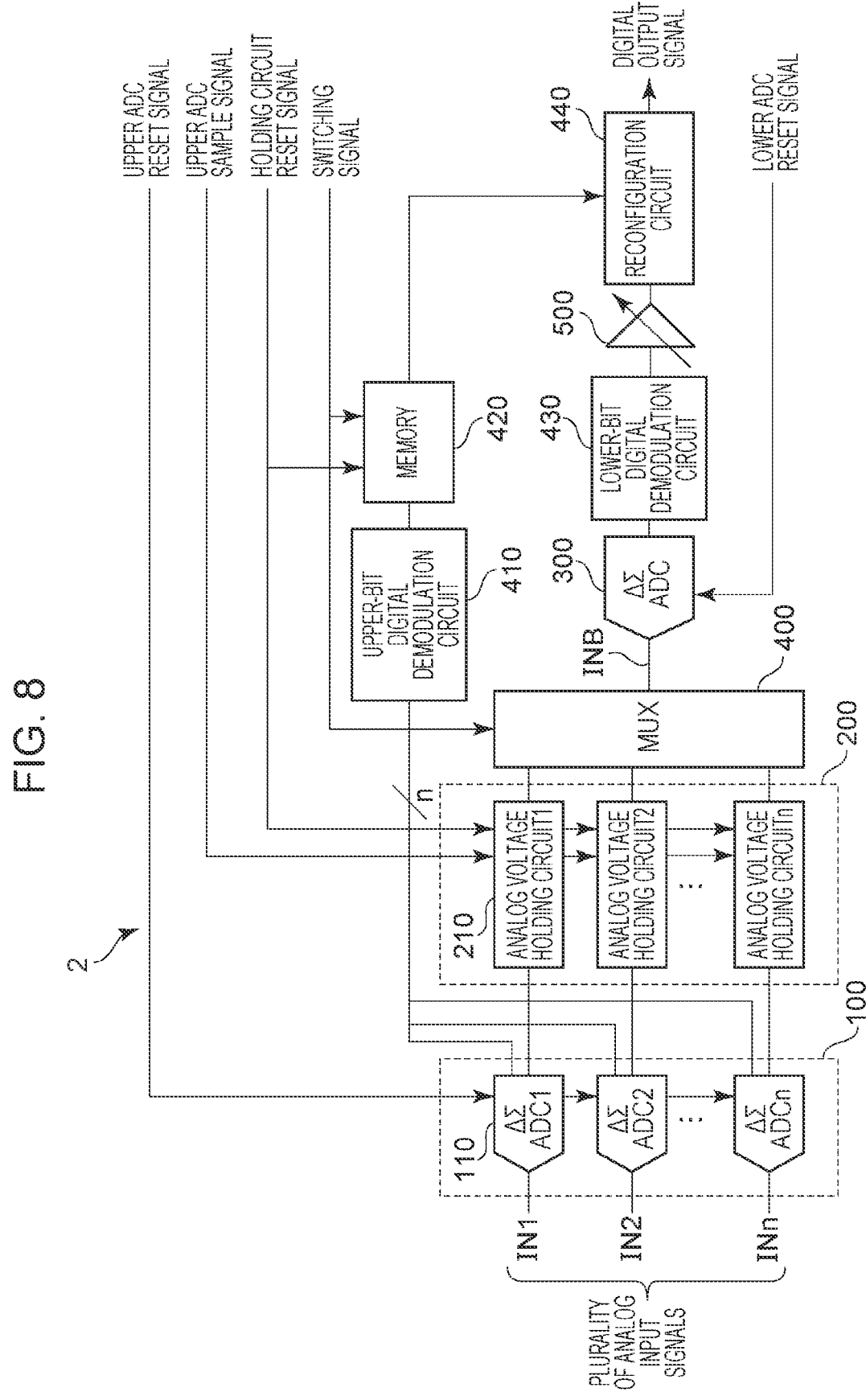
FIG. 8 is a diagram illustrating a configuration of an AD conversion circuit according to a second embodiment.

In FIG. 8, the same reference signs as those in FIG. 1 are assigned to elements having the same functions as those of the elements illustrated in FIG. 1.

An AD conversion circuit 2 illustrated in FIG. 8 further includes a digital gain adjustment circuit 500 disposed between the lower-bit digital demodulation circuit 430, which is an example of the second demodulation circuit, and the reconfiguration circuit 440.

The digital gain adjustment circuit 500 is a circuit configured to apply a digital gain to a digital signal of L bits outputted from the lower-bit digital demodulation circuit 430. An output of the digital gain adjustment circuit 500 is inputted into the reconfiguration circuit 440.

At the residual voltage holding circuit 200, for example, a gain error caused due to a finite gain of an amplification circuit, an error caused due to variation in characteristics different from one to another of the 1st to n-th analog voltage holding circuits, and the like can occur. Because of this error, a deviation from a theoretical value expressed in Equations 2 and 3 can occur between an upper-bit demodulation signal and a lower-bit demodulation signal. This gives rise to non-linearity distortion of the AD converter, resulting in a decrease in AD conversion precision. The configuration of the present embodiment makes it possible to correct this error component by using the digital gain adjustment circuit 500. Therefore, with the configuration of the present embodiment, it is possible to enhance AD conversion precision by correcting the error of the residual voltage holding circuit 200.

The digital gain (correction value) to be applied by the digital gain adjustment circuit 500 can be acquired in advance before AD-converting an analog signal that is the target of the AD conversion. For example, it is possible to generate the correction value by inputting an analog signal of a reference value into the AD conversion circuit 2 and then by comparing a digital signal that is actually outputted from the AD conversion circuit 2 with a digital signal that is supposed to be obtained (expected value). For further enhancing correction precision, performing correction-value acquisition operation by using analog signals of a plurality of different reference values will be effective.

The digital gain adjustment circuit 500 may be, for example, configured to perform gain adjustment on a lower-bit-string digital signal outputted from the digital demodulation circuit 410 and not to perform gain adjustment on an upper-bit-string digital signal outputted from the digital demodulation circuit 410.

Third Embodiment

Figure 9:
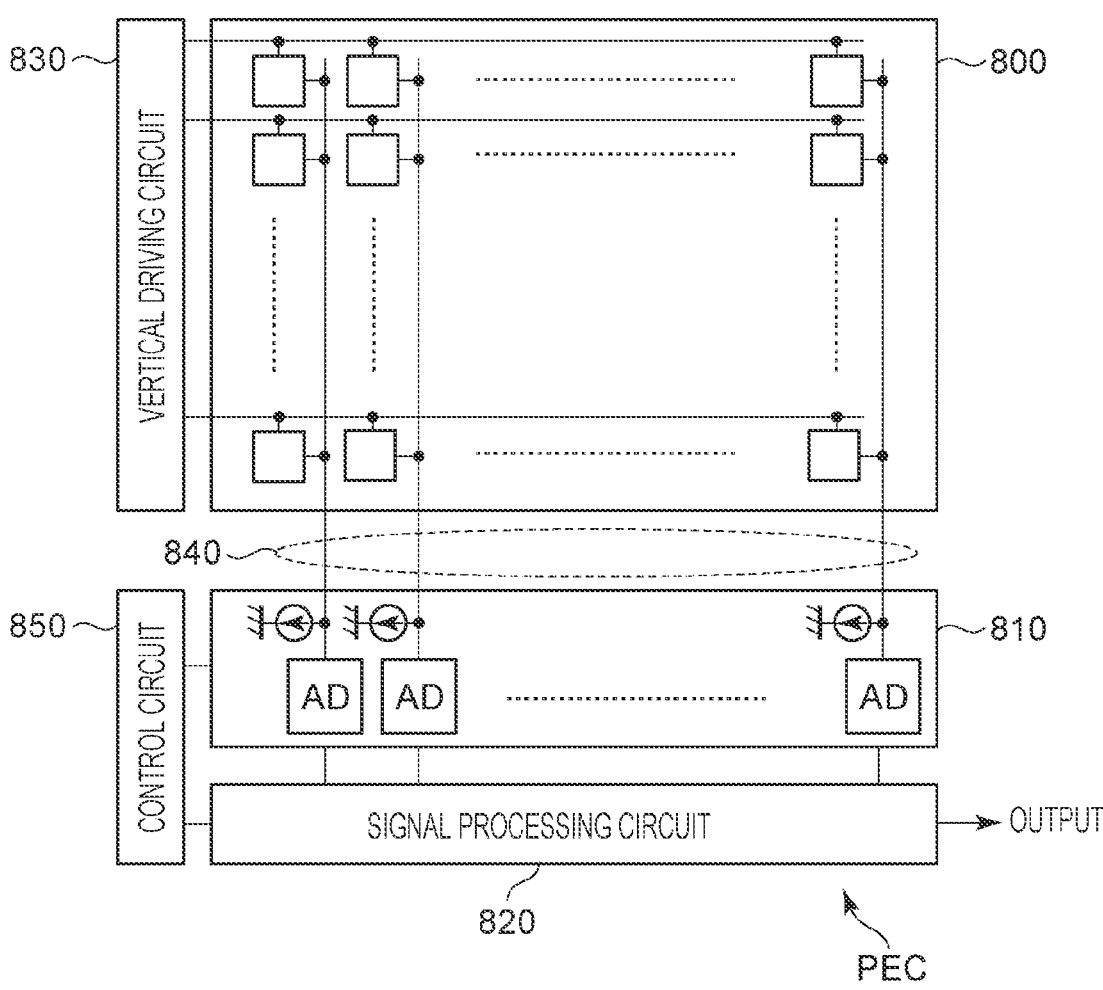
FIG. 9 is a diagram illustrating a configuration of a photoelectric conversion apparatus according to a third embodiment.
Figure 11A:
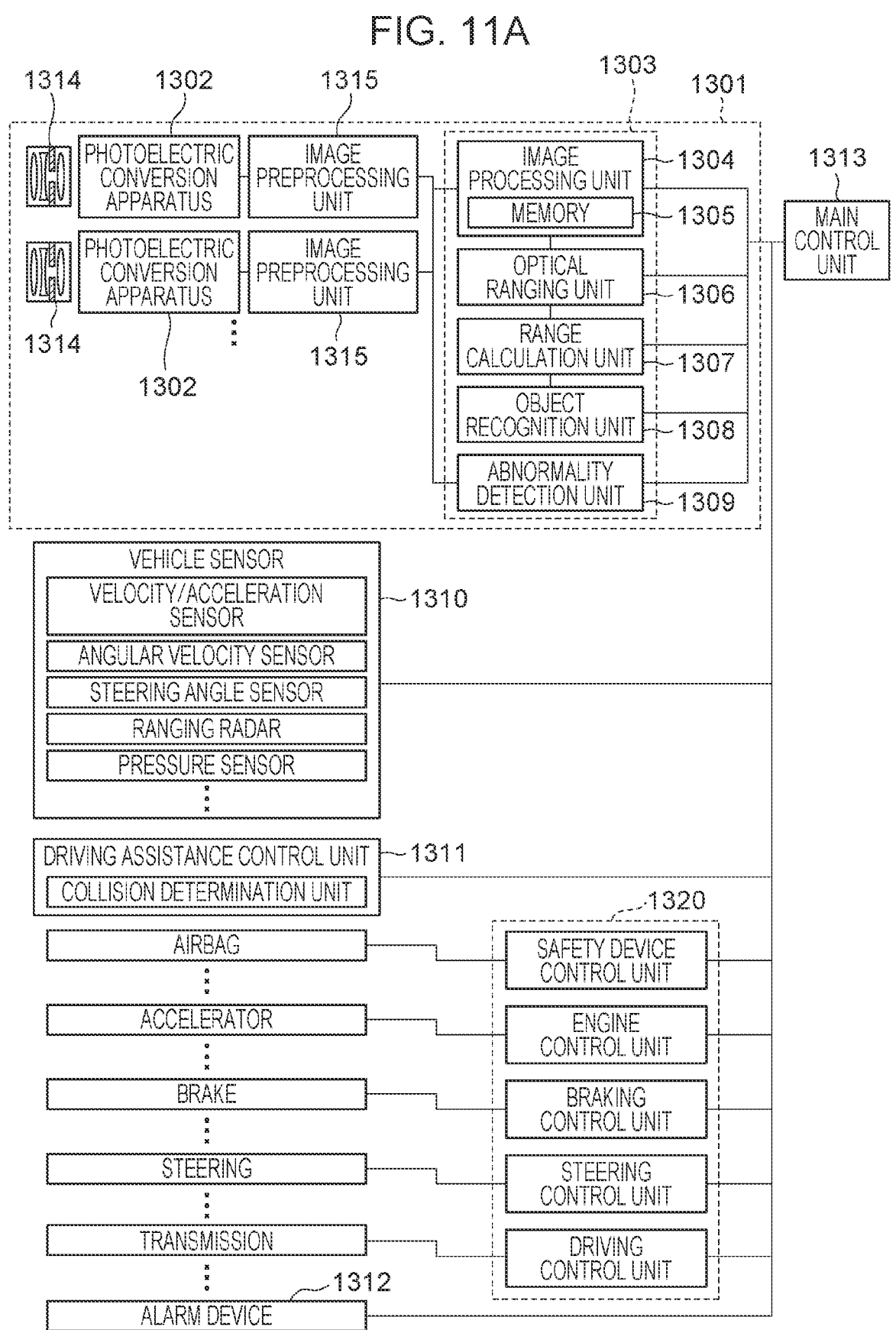
FIGS. 11A, 11B, 11C, and 11D are a diagram illustrating a configuration of a photoelectric conversion system or a moving body.
Figure 11B:
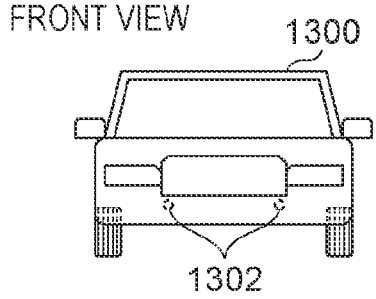
Figure 11C:
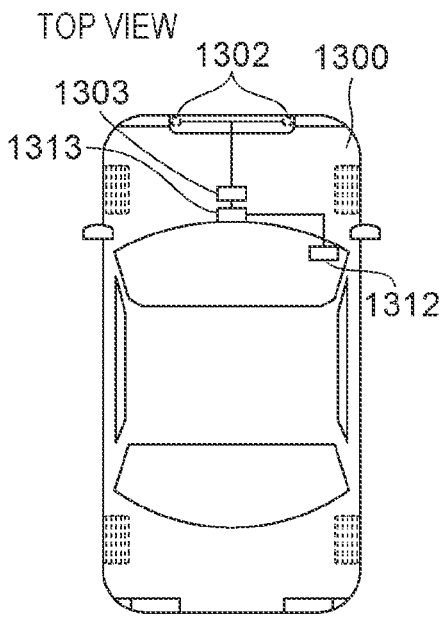
Figure 11D:
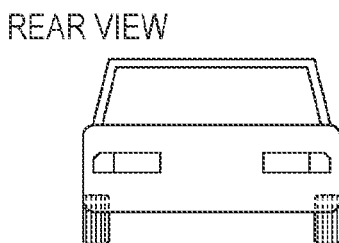

A configuration of a photoelectric conversion apparatus PEC according to a third embodiment of the present disclosure is illustrated in FIG. 9. The photoelectric conversion apparatus PEC may be configured as a solid state imaging apparatus that picks up an image and outputs it. Alternatively, the photoelectric conversion apparatus PEC may be configured as an apparatus that picks up an image and outputs a signal obtained from the picked-up image.

The photoelectric conversion apparatus PEC may include, for example, a pixel array (an array made up of a plurality of photoelectric conversion circuits (photoelectric conversion units) 800, a vertical driving circuit 830, a readout circuit (current source, ADC) 810, a control circuit 850, and a signal processing circuit 820. The readout circuit 810 may include a plurality of current sources connected to a plurality of vertical lines 840 respectively, and a plurality of AD converters configured to perform AD conversion on signals outputted to the plurality of vertical lines 840 from pixels of a selected row. The two-stage continuous-time delta-sigma AD conversion circuit disclosed representatively in the first to third embodiments may be applied to each of the plurality of AD converters of the readout circuit 810. This makes it possible to reduce the size of the readout circuit 810.

The photoelectric conversion apparatus PEC may be configured to, by using the readout circuit 810, read out a reset level from each pixel of the pixel array 800 and an optical signal level of light produced by photoelectric conversion.

The readout circuit 810 may be configured to output a digital signal of the reset level and a digital signal of the light signal level. The signal processing circuit 820 may be configured to perform CDS processing on the digital signal of the reset level and the digital signal of the light signal level and output the CDS-processed signals. The pixel array 800, the vertical driving circuit 830, the readout circuit 810, the control circuit 850, and the signal processing circuit 820 may be configured on a single substrate, may be stacked after being configured on a plurality of substrates in a distributed manner, or may be configured on a plurality of chips in a split manner. The photoelectric conversion apparatus PEC may be a CMOS image sensor. The photoelectric conversion apparatus PEC may be a front-lit-type sensor or a back-lit-type sensor.

An example of a photoelectric conversion system using the photoelectric conversion apparatus according to the third embodiment described above will now be described.

Figure 10:
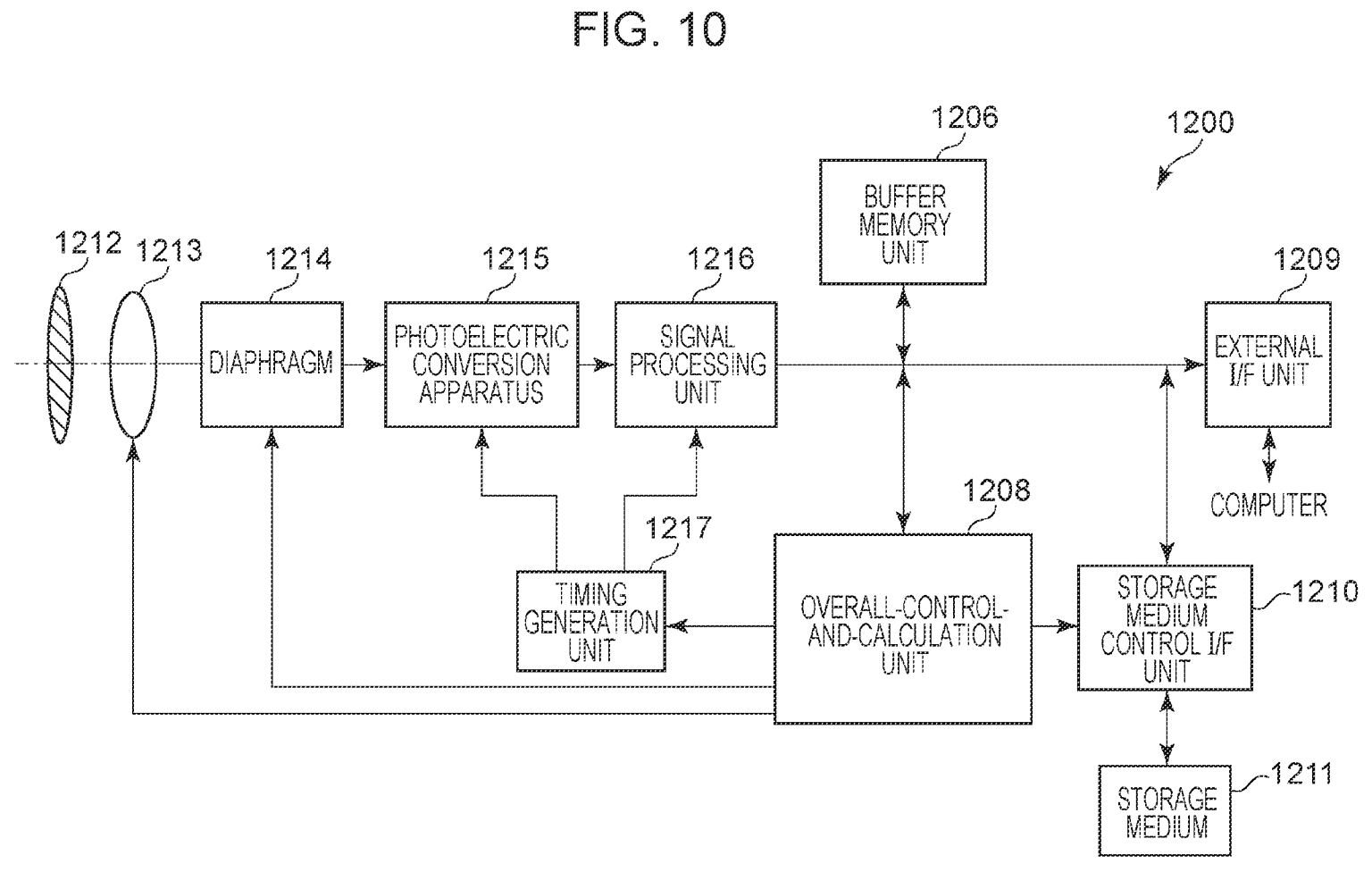

FIG. 10 is a block diagram illustrating a configuration of a photoelectric conversion system 1200 according to the present embodiment. The photoelectric conversion system 1200 according to the present embodiment includes a photoelectric conversion apparatus 1215. The photoelectric conversion apparatus PEC according to the third embodiment can be applied to the photoelectric conversion apparatus 1215. The photoelectric conversion system 1200 can be used as, for example, an imaging system. Specific examples of the imaging system include a digital still camera, a digital camcorder, a surveillance camera, and the like. In FIG. 10, a digital still camera is disclosed as an example of the photoelectric conversion system 1200.

The photoelectric conversion system 1200 illustrated in FIG. 10 includes the photoelectric conversion apparatus 1215, a lens 1213 for forming an optical image of a photographic subject on the photoelectric conversion apparatus 1215, a diaphragm 1214 for making an amount of light that passes through the lens 1213 variable, and a barrier 1212 for protecting the lens 1213.

The lens 1213 and the diaphragm 1214 constitute an optical system for concentrating light onto the photoelectric conversion apparatus 1215. A photoelectric conversion system for imaging use is called also as an imaging system.

The photoelectric conversion system 1200 includes a signal processing unit 1216 that processes an output signal outputted from the photoelectric conversion apparatus 1215. The signal processing unit 1216 performs operation of signal processing for applying various kinds of correction and compression to an input signal as needed, and then outputting the processed signal. The photoelectric conversion system 1200 further includes a buffer memory unit 1206 for temporarily storing image data and an external interface unit (external I/F unit) 1209 for communicating with an external computer or the like.

The photoelectric conversion system 1200 further includes a storage medium 1211 such as a semiconductor memory into or out of which captured image data is written or read and a storage medium control interface unit (storage medium control I/F unit) 1210 for writing into or reading out of the storage medium 1211. The storage medium 1211 may be built in the photoelectric conversion system 1200 or may be configured to be attachable thereto and detachable therefrom.

Communication from the storage medium control I/F unit 1210 to the storage medium 1211 and communication from the external I/F unit 1209 may be performed wirelessly.

The photoelectric conversion system 1200 further includes an overall-control-and-calculation unit 1208 that performs various calculations and controls the entire digital still camera, and a timing generation unit 1217 that outputs various timing signals to the photoelectric conversion apparatus 1215 and to the signal processing unit 1216. The timing signals and so on may be externally inputted. It is sufficient as long as the photoelectric conversion system 1200 includes at least the photoelectric conversion apparatus 1215 and the signal processing unit 1216 that processes an output signal outputted from the photoelectric conversion apparatus 1215. As described in the fourth embodiment, the timing generation unit 1217 may be mounted in the photoelectric conversion apparatus. The overall-control-and-calculation unit 1208 and the timing generation unit 1217 may be configured to execute some or all of control functions of the photoelectric conversion apparatus 1215.

The photoelectric conversion apparatus 1215 outputs an image signal to the signal processing unit 1216. The signal processing unit 1216 performs predetermined signal processing on the image signal outputted from the photoelectric conversion apparatus 1215 and outputs image data. In addition, the signal processing unit 1216 generates an image by using the image signal. The signal processing unit 1216 may perform range calculation for the signal outputted from the photoelectric conversion apparatus 1215. The signal processing unit 1216 and the timing generation unit 1217 may be mounted in the photoelectric conversion apparatus. That is, the signal processing unit 1216 and the timing generation unit 1217 may be provided on the substrate on which pixels are arranged or may be provided on another substrate. Using a photoelectric conversion apparatus according to each of the foregoing embodiments to configure an imaging system makes it possible to realize an imaging system capable of obtaining an image with enhanced quality.

A photoelectric conversion system and a moving body according to the present embodiment will now be described with reference to FIGS. 11A, 11B, 11C, and 11D. FIGS. 11A, 11B, 11C, and 11D are schematic diagrams illustrating an example of a configuration of a photoelectric conversion system and a moving body according to the present embodiment. In the present embodiment, a vehicle-mounted camera is disclosed as an example of the photoelectric conversion system.

FIGS. 11A, 11B, 11C, and 11D illustrate an example of a vehicle system and a photoelectric conversion system mounted in the vehicle system and configured to perform image capturing. A photoelectric conversion system 1301 includes a photoelectric conversion apparatus (apparatuses) 1302, an image preprocessing unit(s) 1315, an integrated circuit 1303, and an optical system(s) 1314. The optical system 1314 forms an optical image of an imaging target on the photoelectric conversion apparatus 1302. The photoelectric conversion apparatus 1302 converts the optical image of the imaging target formed by the optical system 1314 into an electric signal. The photoelectric conversion apparatus 1302 is a photoelectric conversion apparatus according to any of the foregoing embodiments. The image preprocessing unit 1315 performs predetermined signal processing on the signal outputted from the photoelectric conversion apparatus 1302. The function of the image preprocessing unit 1315 may be integrated into the photoelectric conversion apparatus 1302. The photoelectric conversion system 1301 includes at least two sets of the optical system 1314, the photoelectric conversion apparatus 1302, and the image preprocessing unit 1315, and an output from the image preprocessing unit 1315 in each set is inputted into the integrated circuit 1303.

The integrated circuit 1303 is an integrated circuit for use in an imaging system and includes an image processing unit 1304 including a memory 1305, an optical ranging unit 1306, a range calculation unit 1307, an object recognition unit 1308, and an abnormality detection unit 1309. The image processing unit 1304 performs image processing such as development processing, defect correction, and the like on a signal outputted from the image preprocessing unit 1315. The memory 1305 temporarily stores a captured image and stores the defect positions of imaging pixels. The optical ranging unit 1306 performs focusing on the imaging target and performs ranging. The range calculation unit 1307 calculates range information from pieces of image data obtained by the plurality of photoelectric conversion apparatuses 1302. The object recognition unit 1308 recognizes an imaging target such as a car, a road, a sign, a person, and the like. Upon detecting an abnormality in the photoelectric conversion apparatus 1302, the abnormality detection unit 1309 issues an abnormality alarm to a main control unit 1313.

The integrated circuit 1303 may be implemented as hardware designed dedicatedly, a software module, or a combination thereof. Other possible implementations include, for example: an FPGA (Field Programmable Gate Array), an ASIC (Application Specific Integrated Circuit), or the like, or a combination thereof.

The main control unit 1313 centrally controls operations of the photoelectric conversion system 1301, a vehicle sensor 1310, a control unit 1320, and the like. The following scheme may also be employed: the main control unit 1313 is omitted, and each of the photoelectric conversion system 1301, the vehicle sensor 1310, and the control unit 1320 individually has a communication interface and individually transmits and receives a control signal via the communication network (for example, the CAN standard).

The integrated circuit 1303 has a function of transmitting a control signal and setting values to the photoelectric conversion apparatus 1302 upon receiving a control signal from the main control unit 1313 or when commanded by its own control unit.

The photoelectric conversion system 1301 is connected to the vehicle sensor 1310 and can detect the traveling state of the driver's own vehicle including a vehicle speed, a yaw rate, a steering angle, and the like; the state of an environment outside the driver's own vehicle; and the states of vehicles of others and obstacles. The vehicle sensor 1310 is a distance information obtainer that obtains information about a distance to a target object. The photoelectric conversion system 1301 is connected to a driving assistance control unit 1311 that provides various kinds of driving assistance including an automatic steering function, an automatic traveling function, a collision prevention function, and the like. With regard to a collision determination function, among others, a collision with another vehicle or an obstacle is predicted and the occurrence of a collision is determined based on the results of detection by the photoelectric conversion system 1301 and the vehicle sensor 1310. By this means, control for avoiding a predicted collision is performed and a safety device is activated at the time of collision.

The photoelectric conversion system 1301 is connected also to an alarm device 1312 configured to alert the driver on the basis of a result of determination by a collision determination unit. For example, in a case where the possibility of a collision is considered to be high as the result of a determination by the collision determination unit, the main control unit 1313 performs vehicle control to avoid the collision or reduce damage by, for example, applying the brakes, releasing the accelerator, or suppressing engine output power. The alarm device 1312 alerts the user by, for example, sounding an alarm, displaying alarm information on the display screen of, for example, the car navigation system or the instrument panel, or vibrating the seatbelt or the steering wheel.

The embodiments described above can be modified as appropriate within a range of not departing from the spirit of the technical idea. The content of disclosure in this specification encompasses not only the matters that are explicitly described in this specification but also all matters that can be understood from this specification and the drawings attached to this specification. Moreover, the content of disclosure in this specification encompasses also a complementary set for a set of concepts described in this specification. That is, for example, if there is a statement "A is larger than B" in this specification, even if a statement "A is not larger than B" is omitted, it can be said that a concept "A is not larger than B" is also disclosed in this specification. This is because, when there is a statement "A is larger than B", this is premised on that a case where "A is not larger than B" is also considered.

The present disclosure includes the following configurations.

(Configuration 1) An AD conversion circuit includes:

a plurality of first AD converters each including a first input terminal and each being a delta-sigma AD converter;

a plurality of voltage holding circuits each connected to corresponding one of the plurality of first AD converters; a second AD converter being a delta-sigma AD converter and including a second input terminal; and a selector circuit connected to the plurality of voltage holding circuits and to the second input terminal and configured to select, from among the plurality of voltage holding circuits, a voltage holding circuit to be connected to the second input terminal.

(Configuration 2) In the AD conversion circuit according to Configuration 1, each of the plurality of first AD converters includes an integrator, and each of the plurality of voltage holding circuits holds a voltage signal according to a voltage outputted from the integrator of the corresponding one of the plurality of first AD converters.

(Configuration 3) In the AD conversion circuit according to Configuration 2, each of the plurality of voltage holding circuits includes an amplification circuit configured to amplify a signal outputted from the integrator of the corresponding one of the plurality of first AD converters, and a capacitive element configured to hold an output of the amplification circuit as the voltage signal.

(Configuration 4) In the AD conversion circuit according to any of Configurations 1 to 3, the second AD converter generates a first digital signal when one of the plurality of voltage holding circuits is connected to the second input terminal by the selector circuit, and the second AD converter is reset after generating the first digital signal, and the second AD converter generates a second digital signal when another one of the plurality of voltage holding circuits is connected to the second input terminal by the selector circuit, after resetting of the second AD converter.

(Configuration 5) In the AD conversion circuit according to any of Configurations 1 to 4, the AD conversion circuit is a circuit configured to convert an analog signal inputted to the first input terminal into a digital signal of a plurality of bits, a signal corresponding to resolution of upper M bits, M being a number, among the plurality of bits is generated by using a signal outputted from the first AD converter, and a signal corresponding to resolution of lower L bits, L being a number, among the plurality of bits is generated by using a signal outputted from the second AD converter.

(Configuration 6) The AD conversion circuit according to Configuration 5 further includes:

a first demodulation circuit connected to the plurality of first AD converters; and a second demodulation circuit connected to the second AD converter, a digital signal of the upper M bits is generated by the first demodulation circuit, and a digital signal of the lower L bits is generated by the second demodulation circuit.

(Configuration 7) In the AD conversion circuit according to Configuration 6, the digital signal of the upper M bits is a signal whose number of bits is greater than that of the digital signal of the lower L bits.

(Configuration 8) In the AD conversion circuit according to Configuration 6, the digital signal of the upper M bits is a signal whose number of bits is less than that of the digital signal of the lower L bits.

(Configuration 9) The AD conversion circuit according to Configuration 8 further includes:

a reconfiguration circuit configured to generate, by using the digital signal of the upper M bits and the digital signal of the lower L bits, a digital signal of a plurality of bits whose number is a sum of M mentioned above and L mentioned above.

(Configuration 10) The AD conversion circuit according to Configuration 9 further includes:

a gain adjustment circuit disposed between the second demodulation circuit and the reconfiguration circuit.

(Configuration 11) In the AD conversion circuit according to Configuration 10, the gain adjustment circuit performs gain adjustment on the digital signal of the lower L bits.

(Configuration 12) In the AD conversion circuit according to any of Configurations 1 to 11, each of the plurality of first AD converters is a continuous-time delta-sigma AD converter.

(Configuration 13) In the AD conversion circuit according to Configuration 2, each of the plurality of first AD converters includes an integrator, and the integrator is a gm-C integrator.

(Configuration 14) In the AD conversion circuit according to Configuration 12, the second AD converter is a continuous-time delta-sigma AD converter.

(Configuration 15) A photoelectric conversion apparatus includes:

a photoelectric conversion circuit; and the AD conversion circuit according to any of Configurations 1 to 14, the AD conversion circuit being configured to convert an analog signal outputted by the photoelectric conversion circuit into a digital signal.

(Configuration 16) A photoelectric conversion system includes:

the photoelectric conversion apparatus according to Configuration 15; and a signal processor configured to process a signal outputted from the photoelectric conversion apparatus.

(Configuration 17) A moving body includes:

the photoelectric conversion apparatus according to Configuration 15.

The technique disclosed herein realizes an AD conversion circuit operable at a higher speed.

While the present disclosure has described exemplary embodiments, it is to be understood that some embodiments are not limited to the disclosed exemplary embodiments. The scope of the following claims is to be accorded the broadest interpretation so as to encompass all such modifications and equivalent structures and functions.

This application claims priority to Japanese Patent Application No. 2023-067175, which was filed on Apr. 17, 2023 and which is hereby incorporated by reference herein in its entirety.

What is claimed is:

1. An analog-to-digital (AD) conversion circuit, comprising:

a plurality of first AD converters each including a first input terminal and each being a delta-sigma AD converter;

a plurality of voltage holding circuits each connected to a corresponding one of the plurality of first AD converters;

a second AD converter being a delta-sigma AD converter and including a second input terminal; and a selector circuit connected to the plurality of voltage holding circuits and to the second input terminal and configured to select, from among the plurality of voltage holding circuits, a voltage holding circuit to be connected to the second input terminal.

2. The AD conversion circuit according to claim 1, wherein each of the plurality of first AD converters includes an integrator, and each of the plurality of voltage holding circuits holds a voltage signal according to a voltage outputted from the integrator of the corresponding one of the plurality of first AD converters.

3. The AD conversion circuit according to claim 2, wherein each of the plurality of voltage holding circuits includes an amplification circuit configured to amplify a signal outputted from the integrator of the corresponding one of the plurality of first AD converters and includes a capacitive element configured to hold an output of the amplification circuit as the voltage signal.

4. The AD conversion circuit according to claim 1, wherein the second AD converter generates a first digital signal when one of the plurality of voltage holding circuits is connected to the second input terminal by the selector circuit, and the second AD converter is reset after generating the first digital signal, and the second AD converter generates a second digital signal when another one of the plurality of voltage holding circuits is connected to the second input terminal by the selector circuit, after resetting of the second AD converter.

5. The AD conversion circuit according to claim 1, wherein, for each first AD converter of the plurality of first AD converters, the AD conversion circuit is configured to convert an analog signal inputted to the first input terminal into a digital signal of a plurality of bits, and a signal corresponding to a resolution of upper M bits, M being a number, among the plurality of bits is generated by using a signal outputted from the first AD converter, and wherein a signal corresponding to a resolution of lower L bits, L being a number, among the plurality of bits is generated by using a signal outputted from the second AD converter.

6. The AD conversion circuit according to claim 5, further comprising:

a first demodulation circuit connected to the plurality of first AD converters; and a second demodulation circuit connected to the second AD converter, wherein a digital signal of the upper M bits is generated by the first demodulation circuit, and wherein a digital signal of the lower L bits is generated by the second demodulation circuit.

7. The AD conversion circuit according to claim 6, wherein the digital signal of the upper M bits is a signal whose number of bits is greater than that of the digital signal of the lower L bits.

8. The AD conversion circuit according to claim 6, wherein the digital signal of the upper M bits is a signal whose number of bits is less than that of the digital signal of the lower L bits.

9. The AD conversion circuit according to claim 8, further comprising:

a reconfiguration circuit configured to generate, by using the digital signal of the upper M bits and the digital signal of the lower L bits, a digital signal of a plurality of bits whose number is a sum of M and L.

10. The AD conversion circuit according to claim 9, further comprising:

a gain adjustment circuit disposed between the second demodulation circuit and the reconfiguration circuit.

11. The AD conversion circuit according to claim 10, wherein the gain adjustment circuit performs gain adjustment on the digital signal of the lower L bits.

12. The AD conversion circuit according to claim 1, wherein each of the plurality of first AD converters is a continuous-time delta-sigma AD converter.

13. The AD conversion circuit according to claim 1, wherein the second AD converter is a continuous-time delta-sigma AD converter.

14. The AD conversion circuit according to claim 1, wherein each of the plurality of first AD converters includes an integrator, and the integrator is a gm-C integrator.

15. A photoelectric conversion apparatus, comprising:

a photoelectric conversion circuit; and an analog-to-digital (AD) conversion circuit according to claim 1, the AD conversion circuit being configured to convert an analog signal outputted by the photoelectric conversion circuit into a digital signal.

16. A photoelectric conversion system, comprising:

the photoelectric conversion apparatus according to claim 15; and a signal processor configured to process a signal outputted from the photoelectric conversion apparatus.

17. A moving body, comprising:

the photoelectric conversion apparatus according to claim 15; and a controller configured to control movement of the moving body using a signal output from the photoelectric conversion apparatus.

* * * * *